United States Patent [19]
Kumagai

[11] Patent Number: 5,916,455
[45] Date of Patent: Jun. 29, 1999

[54] METHOD AND APPARATUS FOR GENERATING A LOW PRESSURE PLASMA

[75] Inventor: Hiromi Kumagai, Tokyo, Japan

[73] Assignee: Applied Materials, Inc., Santa Clara, Calif.

[21] Appl. No.: 08/676,831

[22] Filed: Jul. 8, 1996

[30] Foreign Application Priority Data

Mar. 18, 1996 [JP] Japan .................................. 8-061550

[51] Int. Cl.⁶ .................................................. H05H 1/00
[52] U.S. Cl. ........................... 216/68; 438/729; 438/730; 156/345; 118/723 I; 118/723 IR; 118/723 MP
[58] Field of Search .......................... 156/345; 118/723 I, 118/723 IR, 723 MP; 216/68; 438/729, 730

[56] References Cited

U.S. PATENT DOCUMENTS

| | | | |
|---|---|---|---|
| 5,449,432 | 9/1995 | Hanawa | 156/345 X |
| 5,476,182 | 12/1995 | Ishizuka et al. | 156/345 X |
| 5,683,548 | 11/1997 | Hartig et al. | 118/723 I X |

*Primary Examiner*—Thi Dang
*Attorney, Agent, or Firm*—Michael Glenn

[57] ABSTRACT

A low pressure plasma ignition method and apparatus includes an ignition cylinder which passes through an anode of a vacuum chamber, where the outlet of the ignition cylinder forms a nozzle. A coil is arranged around the cylinder and a plasma-generating gas supply pipe passes through an upper part of the cylinder. A plasma-generating gas, such as Argon gas, is supplied to the ignition cylinder in this structure, such that a high density plasma is formed in the ignition cylinder that is expelled into the vacuum chamber while the pressure is reduced through the nozzle. In the vacuum chamber, the expelled plasma becomes a seed plasma, such that a low pressure plasma is readily generated in the vacuum chamber.

6 Claims, 2 Drawing Sheets

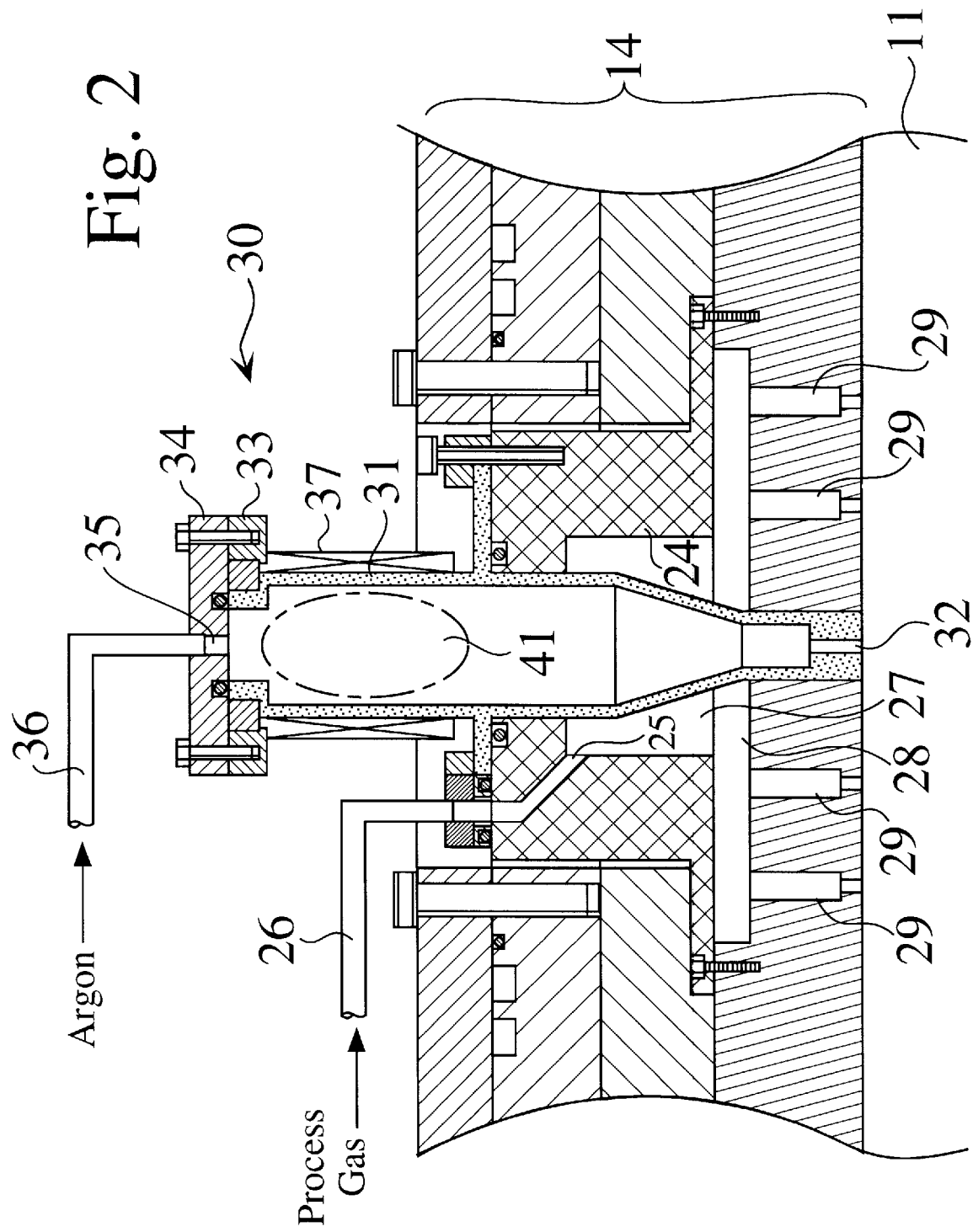

METHOD AND APPARATUS FOR GENERATING A LOW PRESSURE PLASMA

BACKGROUND OF THE INVENTION

1. Technical Field

The invention relates to a device that uses a plasma, for example, a plasma etching device. More particularly, the invention relates to a plasma ignition device, e.g. an igniter, for generating a low pressure plasma.

2. Description of the Prior Art

In recent years, the so-called dry process, for example in which a semiconductor wafer is etched or a thin film is formed using plasma generated at a low pressure, has become significant and indispensable to the manufacture of highly functional and highly integrated semiconductor devices, e.g. ultra-LSI. Plasma etching with a plasma etching device involves active seeds, such as ions that are generated when a chemically active gas (referred to as $^{etching}$ g~5YI below) is discharged in a plasma state. These active seeds interact with a solid material that is to be etched, such as a semiconductor wafer, such that volatile reaction products are formed and released in a vapor phase.

In a typical prior art plasma etching device, the upper opening and the lower opening of the side wall that comprises the vacuum chamber are each closed with an end plate. The upper end plate functions as an anode. A suscepter, which functions as a cathode, is arranged over the lower end plate. A matching circuit and a high frequency bias power source are connected between the anode and the cathode. A coil is also arranged around the vacuum chamber. The matching circuit and high frequency power source are connected to the coil at both ends.

When a high frequency is applied to the coil in such a plasma etching device, a plasma is generated as a result of high frequency coupling to an etching gas introduced into the vacuum chamber. A bias is then separately applied between the anode and the cathode to accelerate the ions, such that a semiconductor wafer mounted over the cathode is etched by the plasma ions.

When the coil to which a high frequency is applied is used to generate a plasma as described above, a portion of the plasma does not proceed toward the object, such as a semiconductor wafer, due to the electric field the coil has generated. Rather, a portion of the plasma proceeds to the side wall of the vacuum chamber, hits the wall of the vacuum chamber, and etches the vacuum chamber wall. Unfortunately, when the voltage applied to the coil is reduced to control such behavior of the plasma, a plasma is not generated in the vacuum chamber if the vacuum chamber is filled with a low pressure etching gas. Filling the vacuum chamber with a high pressure etching gas is not an acceptable alternative with respect to the manufacture of state of the art highly functional and highly integrated semiconductor devices.

It would therefore be advantageous to offer an ignition device for low pressure plasma that can generate low pressure plasma in a vacuum chamber.

SUMMARY OF THE INVENTION

The invention provides an ignition device that is used to generate a low pressure plasma in a process chamber. The process chamber comprises the plasma generating device, including an ignition chamber that passes through the wall of the process chamber; an ignition coil arranged around the circumference of the side wall of the ignition chamber; a high frequency ignition power source connected and applied to the ignition coil; and a pipe passing though the wall of the ignition chamber and projecting outwardly to introduce a plasma-generating gas and thereby generate a high pressure, high-density ignition plasma. The high density plasma thus generated is introduced into the process chamber and used as a seed plasma to, in turn, generate a low pressure plasma, such that discharge begins.

The ignition chamber may also include a nozzle which defines a passage that narrows toward the inside of the process chamber, such that the high density plasma thus produced is expelled from the front end of the ignition chamber.

A semiconductor manufacturing device that uses a plasma that is produced in accordance with the invention includes a process chamber, an ignition chamber connected to the process chamber such that ventilation is possible, a first gas supply means which supplies a plasma generating gas to the ignition chamber, and a plasma ignition means which ignites the plasma. In the preferred embodiment of the invention, the generation of plasma in the process chamber is initiated when a plasma is ignited in the ignition chamber by the plasma ignition means and then expelled into the process chamber as a result of a difference in pressure between the internal pressure of the ignition chamber and the internal pressure of the process chamber. Thus, the plasma produced in the ignition chamber is used as a seed plasma in the low pressure process chamber to generate a low pressure plasma.

The plasma ignition method herein described operates a follows:

The internal pressure of the process chamber and the internal pressure of the ignition chamber, which communicates with the process chamber by means of a nozzle, are reduced to a certain level. A plasma-generating gas is supplied to the ignition chamber until the gas pressure in the process chamber and the ignition chamber reach a first pressure level and a second pressure level, respectively, where the second pressure level is lower than the first pressure level. A plasma is generated in the ignition chamber when power is supplied to a first coil arranged at the outer circumference of the ignition chamber. Generation of a plasma is initiated in the process chamber when power is supplied to a second coil, arranged on the outer circumference of the process chamber, and the ignited plasma enters the process chamber through the nozzle due to a difference in pressure between the first pressure level and the second pressure level. Thus, the interior of the process chamber is maintained at a low pressure because the plasma generated at a high pressure in the ignition chamber is used as a seed plasma.

BRIEF DESCRIPTION OF THE DRAWINGS

FIG. 2 is an enlarged, partial cross-sectional view of the plasma etching device of FIG. 1, showing the plasma ignition device in detail.

DETAILED DESCRIPTION OF THE INVENTION

Figure 1:
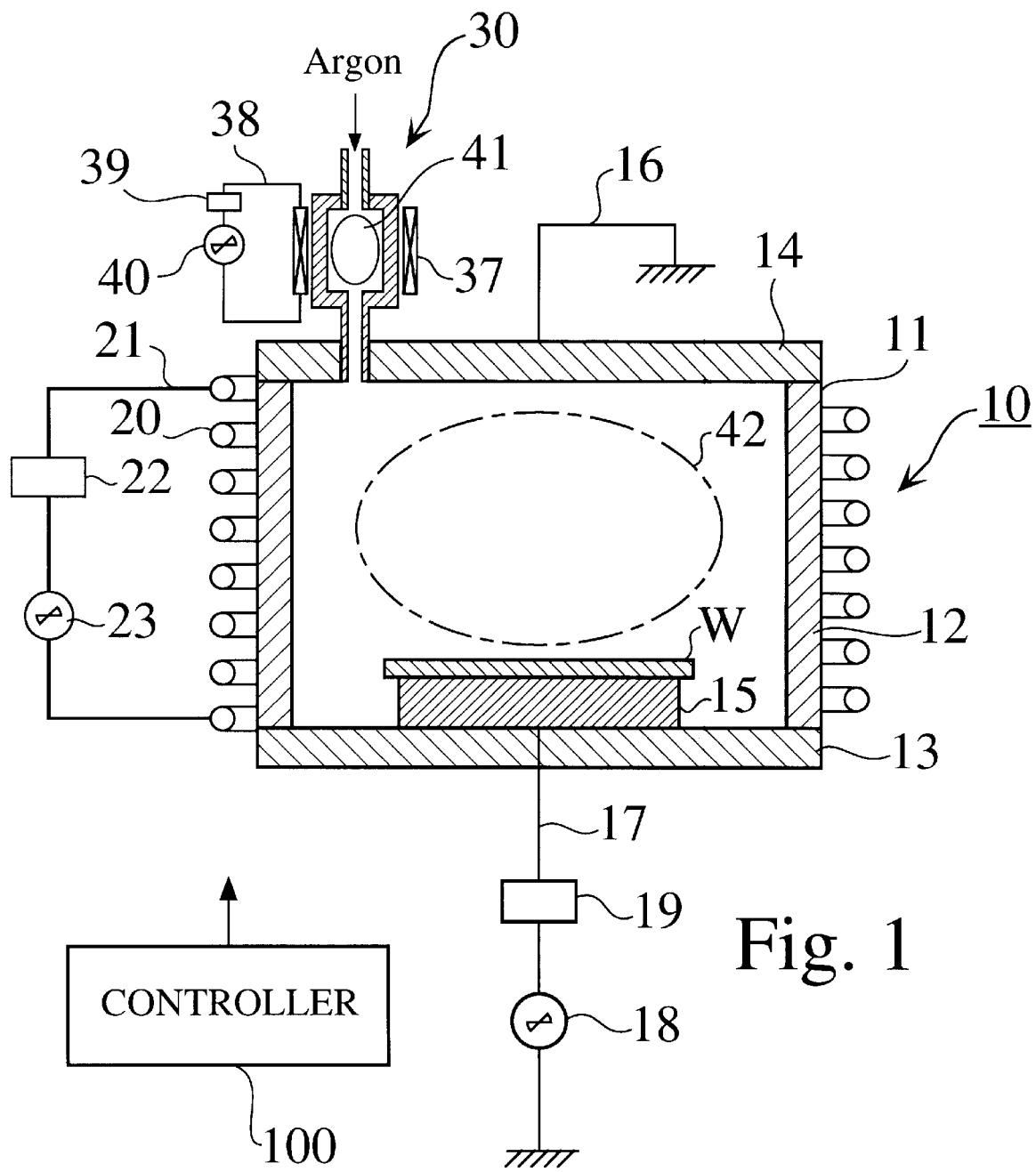
FIG. 1 is a cross-sectional, schematic view of a plasma etching device having a plasma ignition device in accordance with the invention.

A preferred embodiment of the invention is described herein with reference to the figures.

FIG. 1 is a schematic cross-sectional view of a plasma etching device (10) that includes a plasma ignition device

(30) in accordance with the invention. The plasma etching device (10) comprises a vacuum chamber (11) that provides a plasma etching process chamber. The vacuum chamber (11) consists of a side wall (12) having a cylindrical inner surface, an end plate (13) that encloses a lower opening of the side wall (12), and an end plate (14) that encloses an upper opening of the side wall (12). The end plate (14) functions as an anode (the end plate (14) is also referred to as the anode (14) below). A pedestal (15), which functions as a cathode, is arranged on the inner surface of the end plate (13) facing the anode (14). The pedestal (15) is adapted to support a semiconductor wafer W as the material to be etched, which may be placed on its upper surface. An electric lead (16) extends from the anode (14) to ground.

An electric lead (17) that extends from the pedestal (15) and passes through the end plate (13) is grounded through a high frequency bias power source (18). A matching circuit (19) maintains the impedance of the load at 50Ω, which is estimated from the high frequency oscillation, including plasma impedance, at the vacuum chamber (11). A coil (20) is arranged around circumference of the side wall (12) which constitutes the vacuum chamber (11). This coil (20) is connected to a matching circuit (22), as well as to a high frequency power source (23) through electric leads (21) that extend from both ends of the coil. The high frequency bias power source (18), as well as the matching circuit (19), the matching circuit (22), and the high frequency power source (23) may be controlled by a controller (100).

Though not shown in FIG. 1, an etching gas port is provided at the anode (14) to introduce the etching gas into the vacuum chamber (11). The etching gas port, which is clearly illustrated in FIG. 2, includes an etching gas introduction cylinder (24) which is made of insulating material and formed in the anode (14). A through hole (25) is formed at the cylinder (24) and an etching gas supply source (not shown in the figure) is connected to one end of the through hole (25) through a pipe (26) with a valve (not shown). The valve may be connected to the controller (discussed above) to adjust the etching gas to a specified flow rate. The internal space (27) of the cylinder (24) communicates with a header space (28) formed at the anode (14). Multiple small apertures (29), which open into the header space (28) at one end and open into the vacuum chamber (11) at the other end, are formed at the lower part of the anode. When the etching gas supply source is activated and the etching gas is supplied through the pipe (26), the etching gas is uniformly supplied to the vacuum chamber (11) by way of the through hole (25), internal space (27), header space (28), and small apertures (29).

In the embodiment of the invention that is illustrated in the figures, the ignition device (30) is provided at the etching gas introduction port of the plasma etching device (10). In the figures, as illustrated particularly in FIG. 2, the ignition device (30) comprises a virtually cylindrical ignition chamber (31) made of insulating ceramic material, such as alumina or quartz. A lower portion of the ignition chamber is tapered. The lowest end of the ignition chamber is further shaped into a nozzle (32), which narrows toward its end in two steps. The ignition cylinder (31) is installed coaxially to the etching gas introduction cylinder (24) at the etching gas introduction port. The lower part of the ignition chamber is arranged in the internal space (27) of the cylinder (24). The ignition cylinder (31) is positioned such that the mouth of the nozzle (32) is at the same level as the lower surface of the anode (14).

A flange (33) is provided at the upper end of the ignition cylinder (31), and a cover plate (34) is connected to the flange in an airtight manner. A through hole (35) is formed at the central part of the cover plate (34), and an Argon gas supply source (not shown in the figure) is connected to the through hole (35) through a pipe (36) with a valve (not shown). The valve may be connected to the controller (discussed above) to adjust the Argon gas to a specified flow rate.

An ignition coil (37) is arranged on the outer circumference of the ignition cylinder (31). As illustrated in FIG. 1, the ignition coil (37) is connected to a matching circuit (39), as well as to an ignition high frequency power source (40) by an electric lead (38). The matching circuit (39), as well as the ignition high frequency power source (40), may be controlled by the controller.

The function of the plasma ignition device (30) is as follows:

A vacuum pump (not shown), which communicates with the interior of the vacuum chamber (11), is connected in a manner such that ventilation is possible. When the vacuum pump is activated, the respective pressures in the vacuum chamber (11) and the ignition cylinder (31) are reduced to a specified level, for example to 10–'torr.

Thereafter, a supply of argon gas from the argon gas supply source is provided to the ignition cylinder (31) through the pipe (36). At this time, argon gas is supplied to the ignition cylinder (31) at a specified flow rate, for example at 100 SCCM, but gas is not supplied to the vacuum chamber (11) through the pipe (26).

The argon gas supplied to the ignition cylinder (31) enters the vacuum chamber (11) through the nozzle (32). The internal pressure of the ignition cylinder (31) and the internal pressure of the vacuum chamber (11) reach 10 Torr and approximately 10 mTorr, respectively, approximately 10 seconds after the supply of argon gas is begun. This is possible due to an automatic control that maintains the internal pressure in the vacuum chamber (11) at 10 mTorr by detecting the internal pressure of the vacuum chamber with a pressure detector (not shown in the figure) provided below the vacuum chamber (11), and which activates the vacuum pump when the internal pressure of the vacuum chamber (11) increases to more than 10 mTorr.

While the internal pressure in the vacuum chamber (11) is maintained at 10 mTorr by the automatic control discussed above, the diameter of the nozzle is set so that the internal pressure of the ignition cylinder (31) becomes approximately 10 Torr. The diameter and length of the nozzle differ according to many conditions. The preferred embodiment of the invention has a nozzle with an aperture having a diameter of approximately 1 mm and a length of approximately 7 mm.

A high frequency voltage is applied to the coil (37) when the pressure detector detects that the respective internal pressures of the vacuum chamber (11) and the ignition cylinder (31) have reached a specified stable pressure. The starting voltage at this time is 2 kV and the supply power is 100 W. As a result of the application of voltage, a plasma discharge is initiated in the ignition cylinder that reaches a stable state after several seconds, typically 5 to 10 seconds in thepreferred embodiment of the invention. The stable state of the plasma discharge in the ignition cylinder (31) is detected by, for example a reduction in the reflection of current to the power source due to matching impedance. A portion of the generated plasma enters the vacuum chamber (11) through the nozzle (32).

A high frequency voltage is then applied to the coil (20). The starting voltage at this time is 5 kV and the power supply is 1800 W. When the plasma generated in the ignition cylinder (31) is expelled into the vacuum chamber (11) through the nozzle (32), a low starting voltage of approximately 5 kV, which is also a high frequency voltage, is applied to the coil (20). Thus, the plasma from the interior of the ignition cylinder (31) becomes a seed, and a plasma is therefore readily generated in the vacuum chamber.

Next, a supply of the etching gas is provided through the pipe (26). The etching gas enters the vacuum chamber (11) uniformly by way of the through hole (25), internal space (27), header space (28), and small apertures (29). At this time, the path of the etching gas is separated from the internal space of the ignition gas by the cylinder (31) itself. Therefore, the etching gas does not enter and mix inside the cylinder (31) and react with the plasma (41) therein.

Argon gas is mixed at a proportion of 1:10 with a process gas, such as $C_4Fe$, in the etching gas. After the supply of etching gas to the vacuum chamber (11) begins, the amount of the etching gas so supplied is gradually increased, such that it reaches 100 SCCM in approximately 10 seconds. Conversely, the supply of Argon gas to the ignition cylinder (31) is gradually decreased, such that the amount supplied reaches zero after approximately 10 seconds. More precisely, the process switches from the Argon gas that is supplied to the ignition chamber to the etching gas that is supplied to the vacuum chamber while maintaining the total amount of the gases flowing into the vacuum chamber (12) at 100 SCCM. By keeping the total amount of the gases flowing into the vacuum chamber (12) constant in this way, the change in the plasma impedance can be kept to a minimum, such that stable plasma generation is possible.

The impedance of the chamber changes due to the switching of gases, but a stable state is obtained when impedance matching is provided by the matching circuit. The attainment of a stable state can be detected by, for example detecting a reduction in the amount of current reflected to the power source.

When a stable state has been maintained for approximately 10 seconds, the bias high frequency current source is activated, and a bias of approximately 1200 W is applied to the pedestal (15). A wafer (W) on top of the pedestal (15) is etched by ions that are drawn in by the bias voltage.

In the preferred embodiment of the invention described above, the opening and closing of the valves of the pipes (26) and (36) which are connected to the gas sources, detection of the internal pressure of the vacuum chamber (11), control functions such as control of the power source, and the detecting function are achieved by a controller (100) which is connected to each of the parts. Such controller is readily implemented by those skilled in the art in accordance with the specific process requirements of the application with which the invention is used.

As described above, ignition of the plasma is attained at a low starting voltage when the plasma is generated in the process chamber. Therefore, the number of plasma ions that would otherwise be generated by a high starting voltage (10 kV, for example), and that therefore would collide with the side wall (12) in a conventional device are reduced, and erosion of the side wall is controlled. As a result, byproducts of such erosion also are controlled, and contamination of the semiconductor W is reduced. Thus, a plasma (42) is readily generated at a low pressure, particularly in a plasma etching device (10) that uses the plasma ignition device (30) described herein. Therefore, the average free progress of the plasma ions increases, and anisotropy in the etching shape can be selected easily because ionization is high. Accordingly, a highly accurate etch is provided.

A preferred embodiment of the invention is explained above. However, the invention is not limited only to that embodiment. For example, the ignition gas supplied to the ignition device is not limited only to Argon gas. Also, the etching gas introduction port and the ignition device (30) are located at the same section. However, the location of the ignition device can be appropriately changed. Furthermore, in addition to the nozzle, a means such as an orifice can be considered as a means to taper the outlet of the cylinder (31).

As described above, the ignition device can be applied effectively to so-called inductive coupling type etching devices. It also can be applied to plasma etching devices of other forms, e.g. plasma PVD devices and plasma CVD devices.

The high density plasma generated in the ignition device is introduced into the vacuum chamber as seed plasma. Therefore, a stable plasma can be generated and maintained even though the pressure inside the vacuum chamber is relatively low. When a tapering means, such as a nozzle, is provided at the outlet of the cylinder in the ignition device, the internal pressure in the cylinder can be maintained at a pressure that is suitable for the generation of plasma based on the pressure of the vacuum chamber. Thus, a means that adjusts the internal pressure of the cylinder, a separate vacuum system, and a pressure adjusting device in the argon gas supply source, for example, become unnecessary, and simplification of the device is possible.

In the invention, contamination of the object to be processed by erosion products of the side wall of the vacuum chamber, and formation of a thin film on the side wall of the vacuum chamber can be controlled using plasma at a low pressure. Furthermore, processing, such as etching, using a plasma becomes easy, and there is also the benefit of improving the quality and yield of the intended product Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

I claim:

1. A plasma ignition method in which an internal pressure of a process chamber and an internal pressure of an ignition chamber, which communicates with said process chamber through a nozzle, are reduced to a specified level, said method comprising the steps of:

supplying a first gas to said ignition chamber until an internal gas pressure of said process chamber and said ignition chamber, respectively, reach a first pressure level and a second pressure level, which is lower than said first pressure level;

generating an ignited plasma in said ignition chamber when power is supplied to a first coil arranged on an outer circumference of said ignition chamber;

initiating generation of a plasma in said process chamber when said ignited plasma enters said process chamber through said nozzle, due to a difference in pressure between said first pressure level and said second pressure level, when power is supplied to a second coil arranged on an outer circumference of said process chamber; and gradually decreasing a supply of said first gas to said ignition chamber, and gradually increasing a supply of a second gas to said process chamber, in response to stabilization of a discharge for a generation of plasma in said process chamber.

2. A semiconductor manufacturing device which uses plasma, comprising:

a process chamber;

an ignition chamber connected to said process chamber in a manner such that ventilation is possible;

a first gas supply means for supplying a first gas to said ignition chamber;

a plasma ignition means for igniting a plasma with said first gas supplied to said ignition chamber by said first gas supply means;

wherein generation of a plasma is initiated in said process chamber when a plasma in said ignition chamber that is ignited by said plasma ignition means is expelled into said process chamber due to a difference in pressure between an internal pressure of said ignition chamber and an internal pressure of said process chamber;

a second gas supply means for supplying process gas and said plasma-generating gas to said process chamber;

means for gradually decreasing a supply of said first gas to said ignition chamber when a discharge for generation of plasma in said process chamber becomes stable; and means for gradually increasing a supply of said second gas to said process chamber in an amount equivalent to said reduction of said first gas to said ignition chamber.

3. The semiconductor manufacturing device of claim 2, wherein said process chamber is connected to said ignition chamber through a nozzle having a specified diameter in a manner such that ventilation is possible.

4. The semiconductor manufacturing device of claim 2, wherein said plasma ignition means further comprises:

a coil arranged on an outer circumference of said ignition chamber; and an ignition power source means for supplying power to said coil.

5. The semiconductor manufacturing device of claim 1, further comprising:

a coil arranged on an outer circumference of said process chamber; and a power source means for supplying power to said coil.

6. A semiconductor manufacturing device, comprising:

an ignition chamber;

a process chamber connected to said ignition chamber in a manner such that ventilation is possible;

a pressure reducing means which reduces respective internal pressures of said ignition chamber and said process chamber to a specified level;

a plasma-generating gas supply means for supplying a first gas to said ignition chamber until an internal gas pressure of said process chamber and said ignition chamber, respectively, reach a first pressure level and a second pressure level, which is lower than said first pressure level;

an ignition plasma generating means, provided with a first coil arranged on an outer circumference of said ignition chamber, which generates ignited plasma in said ignition chamber by supplying power to said first coil;

a plasma generating means provided with a processing coil arranged on an outer circumference of said process chamber, such that a plasma is generated in said process chamber when, due to the difference in pressure between said first pressure level and said second pressure level, said ignited plasma enters said process chamber through said nozzle when power is supplied to said processing coil;

means for gradually decreasing a supply of said first gas to said ignition chamber according to said generation of plasma in said process chamber; and means for directing supply of a second gas to said process chamber in response to the generation of plasma in said process chamber, wherein a direct supply of said second gas to said process chamber is gradually increased, and a total amount of said first and second gas supplied to said process chamber is maintained almost constant.

* * * * *